(12) United States Patent
Shin et al.

(10) Patent No.: US 10,108,369 B2
(45) Date of Patent: Oct. 23, 2018

(54) MEMORY SYSTEM AND OPERATING METHOD THEREOF

(71) Applicant: SK hynix Inc., Gyeonggi-do (KR)

(72) Inventors: Soong-Sun Shin, Gyeonggi-do (KR); Young-Mi Yoon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 1 day.

(21) Appl. No.: 15/633,898

(22) Filed: Jun. 27, 2017

(65) Prior Publication Data

US 2018/0129445 A1 May 10, 2018

(30) Foreign Application Priority Data

Nov. 7, 2016 (KR) .......................... 10-2016-0147404

(51) Int. Cl.
| | | |
|---|---|---|
| *G06F 12/00* | (2006.01) | |
| *G06F 3/06* | (2006.01) | |
| *G06F 12/02* | (2006.01) | |
| *G11C 7/22* | (2006.01) | |
| *G11C 16/16* | (2006.01) | |

(52) U.S. Cl.
CPC .......... *G06F 3/0652* (2013.01); *G06F 3/0604* (2013.01); *G06F 3/0659* (2013.01); *G06F 3/0673* (2013.01); *G06F 12/0246* (2013.01); *G11C 7/22* (2013.01); *G11C 16/16* (2013.01); *G06F 2212/7205* (2013.01); *G11C 2216/20* (2013.01)

(58) Field of Classification Search
CPC ......... G06F 12/0246; G06F 2212/7205; G06F 2212/72; G06F 3/0652; G06F 3/0604; G06F 3/0659; G06F 3/0673; G11C 7/22; G11C 16/16; G11C 2216/20
See application file for complete search history.

(56) References Cited

U.S. PATENT DOCUMENTS

2013/0198451 A1 * 8/2013 Hyun .................... G06F 3/0652
711/114

FOREIGN PATENT DOCUMENTS

KR 1020150116352 10/2015

* cited by examiner

*Primary Examiner* — Shawn X Gu
(74) *Attorney, Agent, or Firm* — IP & T Group LLP

(57) ABSTRACT

A memory system may include: a memory device; and a controller configured to: perform a read operation and an erase operation to the memory device; predict a first required time when a read command is received during the performing of the erase operation, the first required time being based on a sum including a first time required for the read operation in response to the read command and a second time required for the on-going erase operation; and determine whether to halt or continue the erase operation according to the first required time.

16 Claims, 9 Drawing Sheets

| ITEM | THRESHOLD TIME (ms) | TARGET PERFORMANCE (%) |
|---|---|---|
| FIRST MANUFACTURING COMPANY | 6 | 5(99.999) |
| SECOND MANUFACTURING COMPANY | 7 | 4(99.99) |
| THIRD MANUFACTURING COMPANY | 8 | 6(99.9999) |
| ⋮ | ⋮ | ⋮ |

| ITEM | THRESHOLD TIME (ms) | TARGET PERFORMANCE (%) |
|---|---|---|
| FIRST MANUFACTURING COMPANY | 6 | 5(99.999) |
| SECOND MANUFACTURING COMPANY | 7 | 4(99.99) |
| THIRD MANUFACTURING COMPANY | 8 | 6(99.9999) |
| ⋮ | ⋮ | ⋮ |

MEMORY SYSTEM AND OPERATING METHOD THEREOF

CROSS-REFERENCE TO RELATED APPLICATIONS

The present application claims priority of Korean Patent Application No. 10-2016-0147404, filed on Nov. 7, 2016, which is incorporated herein by reference in its entirety.

BACKGROUND

1. Field

Exemplary embodiments relate to a memory system including a memory device and an operating method thereof.

2. Description of the Related Art

The computer environment paradigm has changed to ubiquitous computing systems that can be used anytime and anywhere. Due to this fact, use of portable electronic devices such as mobile phones, digital cameras, and notebook computers has rapidly increased. These portable electronic devices generally use a memory system having one or more memory devices for storing data. A memory system may be used as a main memory device or an auxiliary memory device of a portable electronic device.

Memory systems provide excellent stability, durability, high information access speed, and low power consumption since they have no moving parts. Examples of memory systems having such advantages include universal serial bus (USB) memory devices, memory cards having various interfaces, and solid state drives (SSD).

Typically, a memory system may perform a read operation while performing an erase operation to the memory device. That is, when a read command is detected during the execution of an erase operation, the memory system may interrupt the erase operation and perform the read operation. As a result, completion of the erase operation is delayed and operational efficiency may be reduced.

SUMMARY

Various embodiments are directed to a memory system capable of minimizing the degree of complexity and performance deterioration of a memory device, maximizing its use efficiency and providing a faster and more stable processing of data to and from the memory device, and an operating method thereof.

In an embodiment, a memory system may include: a memory device; and a controller configured to: perform a read operation and an erase operation to the memory device; predict a first required time when a read command is received during the performing of the erase operation, the first required time being based on a sum including a first time required for the read operation in response to the read command and a second time required for the on-going erase operation; and determine whether to halt or continue the erase operation according to the first required time.

The first required time may further include a time required to halt the on-going erase operation and reopen the halted erase operation.

The erase operation may include a first erase operation of selecting a target memory block from the memory blocks, and a second erase operation of erasing data stored in the selected target memory block. When the first required time is smaller than a threshold time and the read command is provided during the first erase operation, the controller may halt the on-going erase operation, performs the read operation, and may reopen the halted erase operation after the read operation is completed.

When the first required time is equal to or greater than the threshold time, the controller may perform the read operation after completion the on-going erase operation.

The erase operation may include a first erase operation of selecting a target memory block from the memory blocks, and a second erase operation of erasing data stored in the selected target memory block. When the first required time is smaller than a threshold time and the read command is provided during the second erase operation, the controller may further predict a second required time, which is a sum of a first time required for the read operation in response to the read command, a second time required for the on-going erase operation and a time loss to occur when the second operation stops and starts from a beginning, and may sequentially perform one and the other between the read operation and the second erase operation according to the second required time.

The first time may include a time required to halt the on-going second erase operation and start the halted second erase operation.

When the second required time is smaller than a threshold time, the controller may halt the on-going second erase operation, may perform the read operation, and may start the second erase operation from the beginning after the read operation is completed.

When the second required time is equal to or greater than the threshold time, the controller may perform the read operation after completion the on-going second erase operation.

In an embodiment, an operating method of a memory system including a memory device, the operating method may include: performing an erase operation to the memory device; predicting a first required time, which is a sum of a first time required for the read operation in response to the read command and a second time required for the on-going erase operation when a read command is provided during the erase operation; and sequentially performing one and the other one between the read operation and the on-going erase operation according to the first required time.

The first time may include a time required to halt the on-going erase operation and reopen the halted erase operation.

The erase operation may include a first erase operation of selecting a target memory block from the memory blocks, and a second erase operation of erasing data stored in the selected target memory block. When the first required time is smaller than a threshold time and the read command is provided during the first erase operation, the sequentially performing may include: halting the on-going erase operation; performing the read operation; and reopening the halted erase operation after the read operation is completed.

When the first required time is equal to or greater than the threshold time, the sequentially performing may include performing the read operation after completion the on-going erase operation.

The erase operation may include a first erase operation of selecting a target memory block from the memory blocks, and a second erase operation of erasing data stored in the selected target memory block. When the first required time is smaller than a threshold time and the read command is provided during the second erase operation, the sequentially performing may include: predicting a second required time, which is a sum of a first time required for the read operation in response to the read command, a second time required for the on-going erase operation and a time loss to occur when the second operation stops and starts from a beginning; and sequentially performing one and the other between the read operation and the second erase operation according to the second required time.

The first time may include a time required to halt the on-going second erase operation and start the halted second erase operation.

When the second required time is smaller than a threshold time, the sequentially performing may include: halting the on-going second erase operation; performing the read operation; and starting the second erase operation from the beginning after the read operation is completed.

When the second required time is equal to or greater than the threshold time, the sequentially performing may include performing the read operation after completion the on-going second erase operation.

BRIEF DESCRIPTION OF THE DRAWINGS

These and other features and advantages of the present invention will become apparent to those skilled in the art to which the present invention pertains from the following detailed description in reference to the accompanying drawings, wherein.

DETAILED DESCRIPTION

Figure 1:
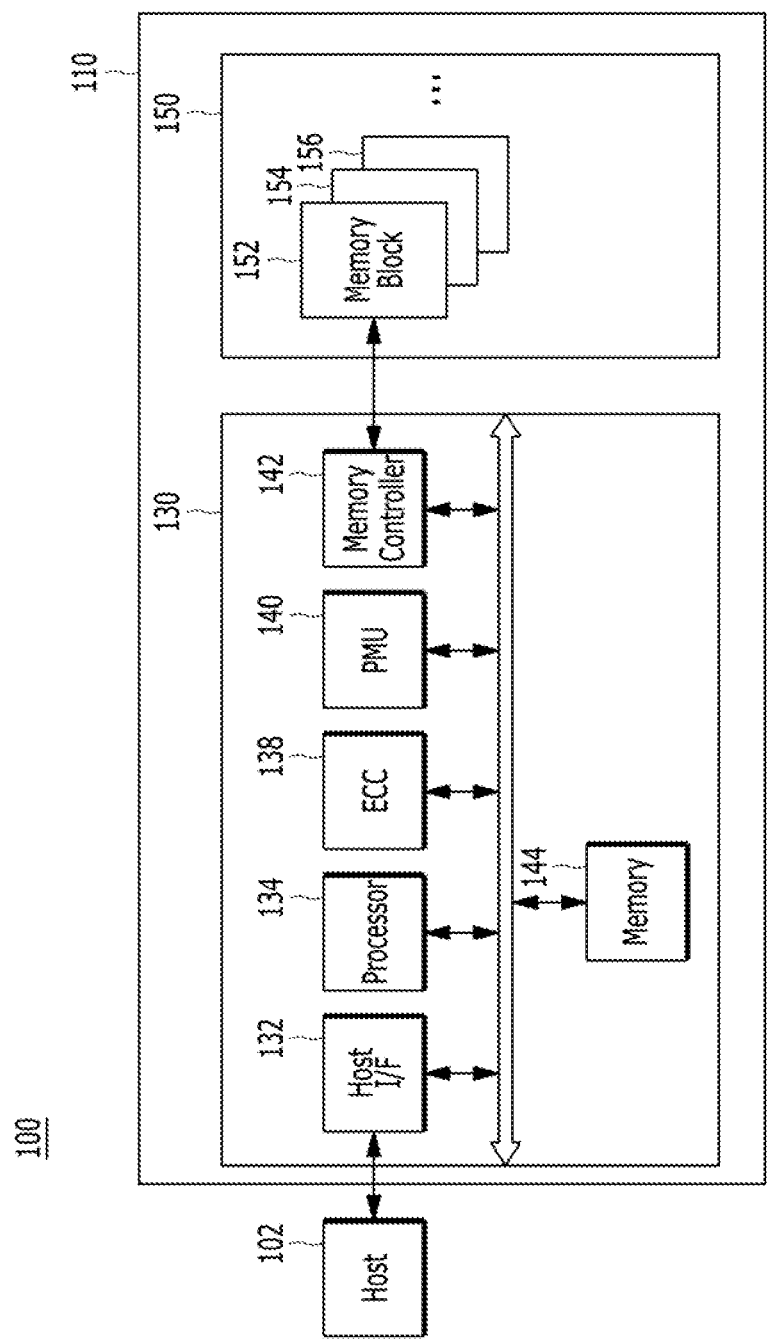
FIG. 1 is a block diagram illustrating a data processing system including a memory system in accordance with an embodiment of the present invention.

Various embodiments of the present invention are described below in more detail with reference to the accompanying drawings. We note, however, that the present invention may be embodied in different other embodiments, forms and variations thereof and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Hereinafter, the various embodiments of the present invention will be described in detail with reference to the attached drawings.

FIG. 1 is a block diagram illustrating a data processing system 100 including a memory system 110 in accordance with an embodiment of the present invention.

Referring to FIG. 1, the data processing system 100 may include a host 102 operatively coupled to the memory system 110.

The host 102 may be any suitable electronic device including portable electronic devices such as a mobile phone, an MP3 player and a laptop computer or non-portable electronic devices such as a desktop computer, a game machine, a TV and a projector.

The host 102 may include at least one OS (operating system). The OS may manage and control the overall functions and operations of the host 102. The OS may provide an operation between the host 102 and a user using the data processing system 100 or the memory system 110. The OS may support functions and operations corresponding to the use purpose and usage of a user. For example, the OS may be divided into a general OS and a mobile OS, depending on the mobility of the host 102. The general OS may be divided into a personal OS and an enterprise OS, depending on the environment of a user. For example, the personal OS may be configured to support a function of providing a service to general users and may include Windows and Chrome. The enterprise OS may be configured to secure and support high performance and may include Windows server, Linux and Unix. Furthermore, the mobile OS may be configured to support a function of providing a mobile service to users and a power saving function of a system and may include Android, iOS and Windows Mobile. In an embodiment, the host 102 may include a plurality of OSs, and execute an OS to perform an operation corresponding to a user's request on the memory system 110. The memory system 110 may operate to store data for the host 102 in response to a request of the host 102. Non-limited examples of the memory system 110 may include a solid state drive (SSD), a multi-media card (MMC), a secure digital (SD) card, a universal storage bus (USB) device, a universal flash storage (UFS) device, compact flash (CF) card, a smart media card (SMC), a personal computer memory card international association (PCMCIA) card and memory stick. The MMC may include an embedded MMC (eMMC), reduced size MMC (RS-MMC) and micro-MMC. The SD card may include a mini-SD card and micro-SD card.

The memory system 110 may be embodied by various types of storage devices. Non-limited examples of storage devices included in the memory system 110 may include volatile memory devices such as a DRAM dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), resistive RAM (RRAM) and a flash memory. The memory system may have a two or a three dimensional structure. In an embodiment, the memory system is a flash memory having a 3-dimensional (3D) stack structure.

The memory system 110 may include a memory device 150 and a controller 130. The memory device 150 may store data for the host 120, and the controller 130 may control data storage into the memory device 150.

The controller 130 and the memory device 150 may be integrated into a single semiconductor device, which may be included in the various types of memory systems as exemplified above. For example, the controller 130 and the memory device 150 may be integrated as one semiconductor device to constitute an SSD. When the memory system 110 is used as an SSD, the operating speed of the host 102 connected to the memory system 110 can be improved. In addition, the controller 130 and the memory device 150 may be integrated as one semiconductor device to constitute a memory card. For example, the controller 130 and the memory device 150 may constitute a memory card such as a PCMCIA (personal computer memory card international association) card, CF card, SMC (smart media card), memory stick, MMC including RS-MMC and micro-MMC, SD card including mini-SD, micro-SD and SDHC, or UFS device.

Non-limited application examples of the memory system 110 may include a computer, an Ultra Mobile PC (UMPC), a workstation, a net-book, a Personal Digital Assistant (PDA), a portable computer, a web tablet, a tablet computer, a wireless phone, a mobile phone, a smart phone, an e-book, a Portable Multimedia Player (PMP), a portable game machine, a navigation system, a black box, a digital camera, a Digital Multimedia Broadcasting (DMB) player, a 3-dimensional television, a smart television, a digital audio recorder, a digital audio player, a digital picture recorder, a digital picture player, a digital video recorder, a digital video player, a storage device constituting a data center, a device capable of transmitting/receiving information in a wireless environment, one of various electronic devices constituting a home network, one of various electronic devices constituting a computer network, one of various electronic devices constituting a telematics network, a Radio Frequency Identification (RFID) device, or one of various components constituting a computing system.

The memory device 150 may be a nonvolatile memory device and may retain data stored therein even though power is not supplied. The memory device 150 may store data provided from the host 102 through a write operation, and provide data stored therein to the host 102 through a read operation. The memory device 150 may include a plurality of memory dies (not shown), each memory die including a plurality of planes (not shown), each plane including a plurality of memory blocks 152 to 156, each of the memory blocks 152 to 156 may include a plurality of pages, and each of the pages may include a plurality of memory cells coupled to a word line.

The controller 130 may control the memory device 150 in response to a request from the host 102. For example, the controller 130 may provide data read from the memory device 150 to the host 102, and store data provided from the host 102 into the memory device 150. The controller 130 may control read, write, program and erase operations of the memory device 150.

The controller 130 may include a host interface (I/F) unit 132, a processor 134, an error correction code (ECC) unit 138, a Power Management Unit (PMU) 140, a memory controller such as a NAND flash controller (NFC) 142 and a memory 144 all operatively coupled via an internal bus.

The host interface unit 132 may be configured to process a command and data of the host 102, and may communicate with the host 102 through one or more of various interface protocols such as universal serial bus (USB), multi-media card (MMC), peripheral component interconnect-express (PCI-E), small computer system interface (SCSI), serial-attached SCSI (SAS), serial advanced technology attachment (SATA), parallel advanced technology attachment (PATA), enhanced small disk interface (ESDI) and integrated drive electronics (IDE).

The ECC unit 138 may detect and correct an error contained in the data read from the memory device 150. In other words, the ECC unit 138 may perform an error correction decoding process to the data read from the memory device 150 through an ECC code used during an ECC encoding process. According to a result of the error correction decoding process, the ECC unit 138 may output a signal, for example, an error correction success/fail signal. When the number of error bits is more than a threshold value of correctable error bits, the ECC unit 138 may not correct the error bits, and may output an error correction fall signal.

The ECC unit 138 may perform error correction through any suitable scheme, included a coded modulation such as Low Density Parity Check (LDPC) code, Bose-Chaudhri- Hocquenghem (BCH) code, turbo code, Reed-Solomon code, convolution code, Recursive Systematic Code (RSC), Trellis-Coded Modulation (TCM) and Block coded modulation (BCM). However, the ECC unit 138 is not limited thereto. The ECC unit 138 may include all circuits, modules, systems or devices for error correction.

The PMU 140 may provide and manage power of the controller 130.

The memory controller (e.g., the NFC) 142 may serve as a memory/storage interface for interfacing the controller 130 and the memory device 150 such that the controller 130 controls the memory device 150 in response to a request from the host 102. The memory controller 142 may generate a control signal for the memory device 150 and process data to be provided to the memory device 150 under the control of the processor 134. The memory controller 142 may work as an interface (e.g., a NAND flash interface) for processing a command and data between the controller 130 and the memory device 150. Specifically, the memory controller 142 may support data transfer between the controller 130 and the memory device 150. When the memory device 150 is a flash memory or specifically a NAND flash memory, the memory controller may be a NAND flash controller.

The memory 144 may serve as a working memory of the memory system 110 and the controller 130, and store data for driving the memory system 110 and the controller 130. The controller 130 may control the memory device 150 to perform read, write, program and erase operations in response to a request from the host 102. The controller 130 may provide data read from the memory device 150 to the host 102, may store data provided from the host 102 into the memory device 150. The memory 144 may store data required for the controller 130 and the memory device 150 to perform these operations.

The memory 144 may be embodied by a volatile memory. For example, the memory 144 may be embodied by static random access memory (SRAM) or dynamic random access memory (DRAM). The memory 144 may be disposed within or out of the controller 130. FIG. 1 exemplifies the memory 144 disposed within the controller 130. In an embodiment, the memory 144 may be embodied by an external volatile memory having a memory interface transferring data between the memory 144 and the controller 130.

The processor 134 may control the overall operations of the memory system 110. The processor 134 may drive firmware to control the overall operations of the memory system 110. The firmware may be referred to as flash translation layer (FTL) The processor 134 of the controller 130 may include a management unit (not illustrated) for performing a bad management operation of the memory device 150. The management unit may perform a bad block management operation of checking a bad block, in which a program fail occurs due to the characteristic of a NAND flash memory during a program operation, among the plurality of memory blocks 152 to 156 included in the memory device 150. The management unit may write the program-failed data of the bad block to a new memory block. In the memory device 150 having a 3D stack structure, the bad block management operation may reduce the use efficiency of the memory device 150 and the reliability of the memory system 110. Thus, the bad block management operation needs to be performed with more reliability.

In accordance with various embodiments, the controller 130 may perform an erase operation with respect to the memory device 150. While performing the erase operation with respect to the memory device 150, the controller 130 may receive a read command for a read operation. Then, the controller 130 may predict a required time on the basis of a time required for the erase operation, that is, an erase time and a delay time (read latency) due to the read operation. On the basis of data corresponding to the read command in the memory device 150, the controller 130 may predict the delay time.

In accordance with various embodiments, during the erase operation, the controller 130 may hold the read command, and decide whether to continuously perform the erase operation or to reopen the erase operation after performing the read command in the stop state of the erase operation. To this end, the controller 130 may compare the required time with a predetermined stop condition. The stop condition may be decided on the basis of a threshold time for ensuring predetermined target performance. For example, when the required time is equal to or more than the threshold time, it may be decided that the required time does not satisfy the stop condition. When the required time is smaller than the threshold time, it may be decided that the required time satisfies the stop condition. That is, the fact that the required time does not satisfy the stop condition may represent that, as the processor 134 performs the read operation during the erase operation, the erase operation may not be completed within the threshold time. Accordingly, when the required time does not satisfy the stop condition, the controller 130 may hold the read command, and may not perform the read operation during the erase operation. Meanwhile, the fact that the required time satisfies the stop condition may represent that, even though the processor 134 performs the read operation during the erase operation, the erase operation may be completed within the threshold time. Accordingly, when the required time satisfies the stop condition, the controller 130 may perform the read operation during the erase operation. The controller 130 may stop the erase operation, perform the read operation, and then reopen the erase operation.

In accordance with various embodiments, the memory system 110 may predict a required time for the erase operation on the basis of a delay time due to the read operation, thereby holding a read command detected while performing the erase operation with respect to the memory device 150. That is, even though the read command is detected during the erase operation, the memory system 110 may hold the read command and may not perform the read operation during the erase operation. Accordingly, the memory system 110 may continuously perform the erase operation regardless of the read command. Consequently, the memory system 110 may maintain the required time for the erase operation substantially within an optimal range. Thus, the memory system 110 may perform an erase operation more efficiently, and thus improve an overall operational efficiency of the memory system.

Figure 2:
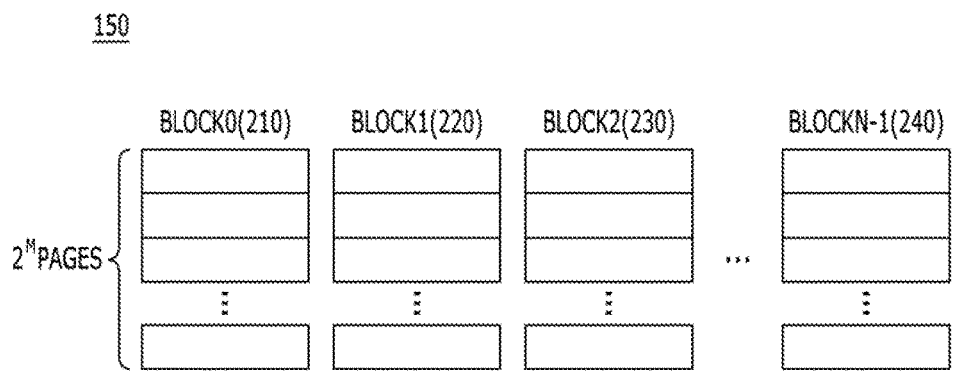
FIG. 2 is a schematic diagram illustrating an exemplary configuration of a memory device employed in the memory system of FIG. 1.

FIG. 2 is a schematic diagram illustrating an exemplary configuration of the memory device 150.

Referring to FIG. 2, the memory device 150 may include a plurality of memory blocks 0 to N−1, and each of the blocks 0 to N−1 may include a plurality of pages, for example, $2^M$ pages, the number of which may vary according to circuit design. Memory cells included in the respective memory blocks 0 to N−1 may be one or more of a single level cell (SLC) storing 1-bit data or a multi-level cell (MLC) storing 2 or more bit data. An MLC storing 3-bit data is also referred to as a triple level cell (TLC), and an MLC storing 4-bit data is also referred to as a quadruple level cell (QLC).

Figure 3:
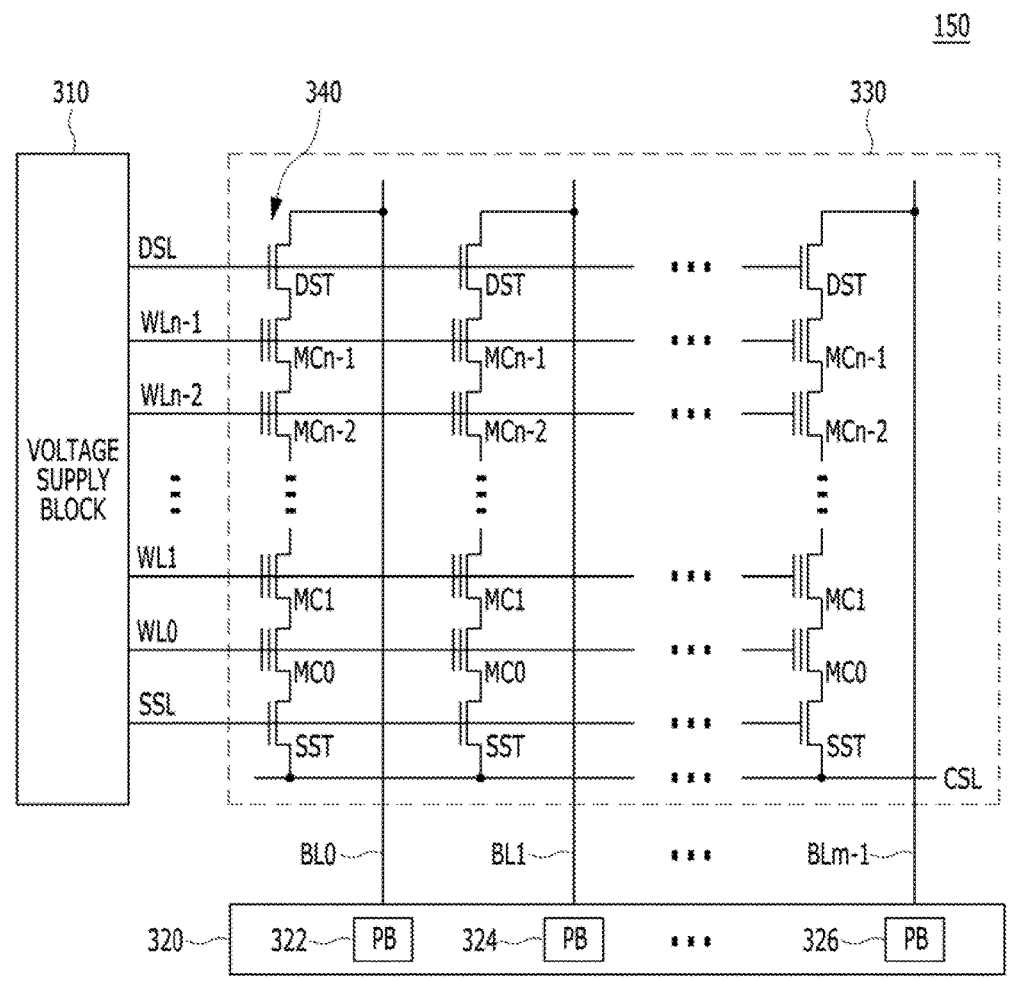
FIG. 3 is a circuit diagram illustrating an exemplary configuration of a memory cell array of a memory block in the memory device of FIG. 2.

FIG. 3 is a circuit diagram illustrating an exemplary configuration of a memory cell array of a memory block in the memory device 150.

Referring to FIG. 3, a memory block 330 which may correspond to any of the plurality of memory blocks 152 to 156 included in the memory device 150 of the memory system 110 may include a plurality of cell strings 340 coupled to a plurality of corresponding bit lines BL0 to BLm−1. The cell string 340 of each column may include one or more drain select transistors DST and one or more source select transistors SST. Between the drain and the source select transistors DST and SST, a plurality of memory cells MC0 to MCn−1 may be coupled in series. In an embodiment, each of the memory cell transistors MC0 to MCn−1 may be embodied by an MLC capable of storing data information of a plurality of bits. Each of the cell strings 340 may be electrically coupled to a corresponding bit line among the plurality of bit lines BL0 to BLm−1. For example, as illustrated in FIG. 3, the first cell string is coupled to the first bit line BL0, and the last cell string is coupled to the last bit line BLm−1.

FIG. 3 illustrates NAND flash memory cells, however, the invention is not limited in this way. It is noted that the memory cells may be of any suitable type, including, for example, NOR flash memory cells, or hybrid flash memory cells including two or more kinds of memory cells combined therein. In an embodiment, the memory device 150 may be a flash memory device including a conductive floating gate as a charge storage layer or a charge trap flash (CTF) memory device including an insulation layer as a charge storage layer.

The memory device 150 may further include a voltage supply block 310 which provides word line voltages including a program voltage, a read voltage and a pass voltage to supply to the word lines according to an operation mode. The voltage generation operation of the voltage supply unit 310 may be controlled by a control circuit (not illustrated). Under the control of the control circuit, the voltage supply unit 310 may select one of the memory blocks (or sectors) of the memory cell array, select one of the word lines of the selected memory block, and provide the word line voltages to the selected word line and the unselected word lines as may be needed.

The memory device 150 may include a read/write circuit 320 which is controlled by the control circuit. During a verification/normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs), and each of the page buffers 322 to 326 may include a plurality of latches (not illustrated).

Figure 4:
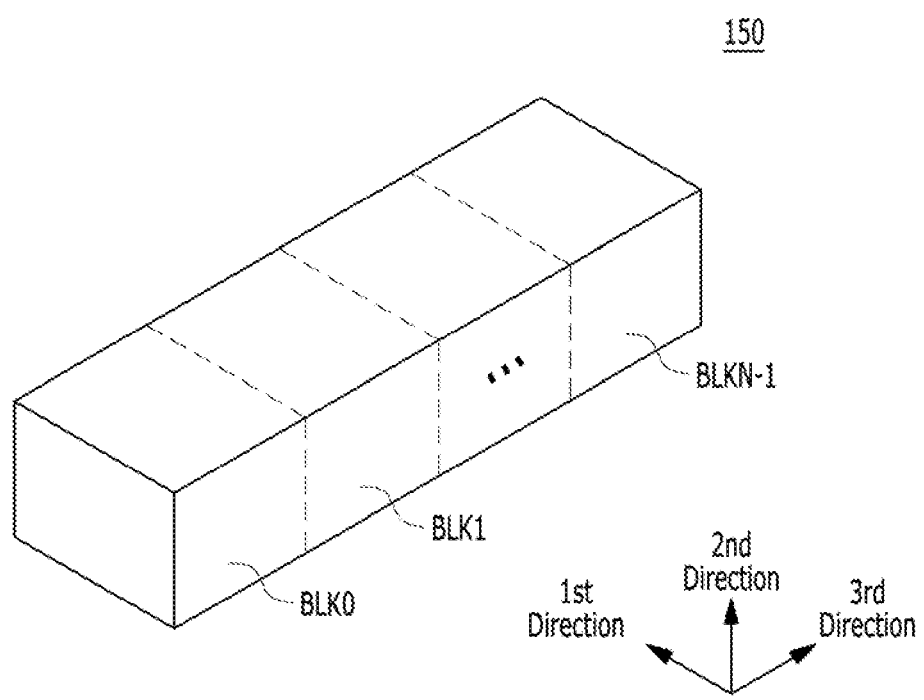
FIG. 4 is a schematic diagram illustrating an exemplary three-dimensional structure of the memory device of FIG. 2.

The memory device 150 may be embodied by a 2D or 3D memory device. FIG. 4 is a schematic diagram illustrating an exemplary 3D structure of the memory device 150.

Specifically, as illustrated in FIG. 4, the memory device 150 may be embodied by a nonvolatile memory device having a 3D stack structure. When the memory device 150 has a 3D structure, the memory device 150 may include a plurality of memory blocks BLK0 to BLKN−1 each of the memory blocks having a 3D structure (or vertical structure).

Figures 5, 6:
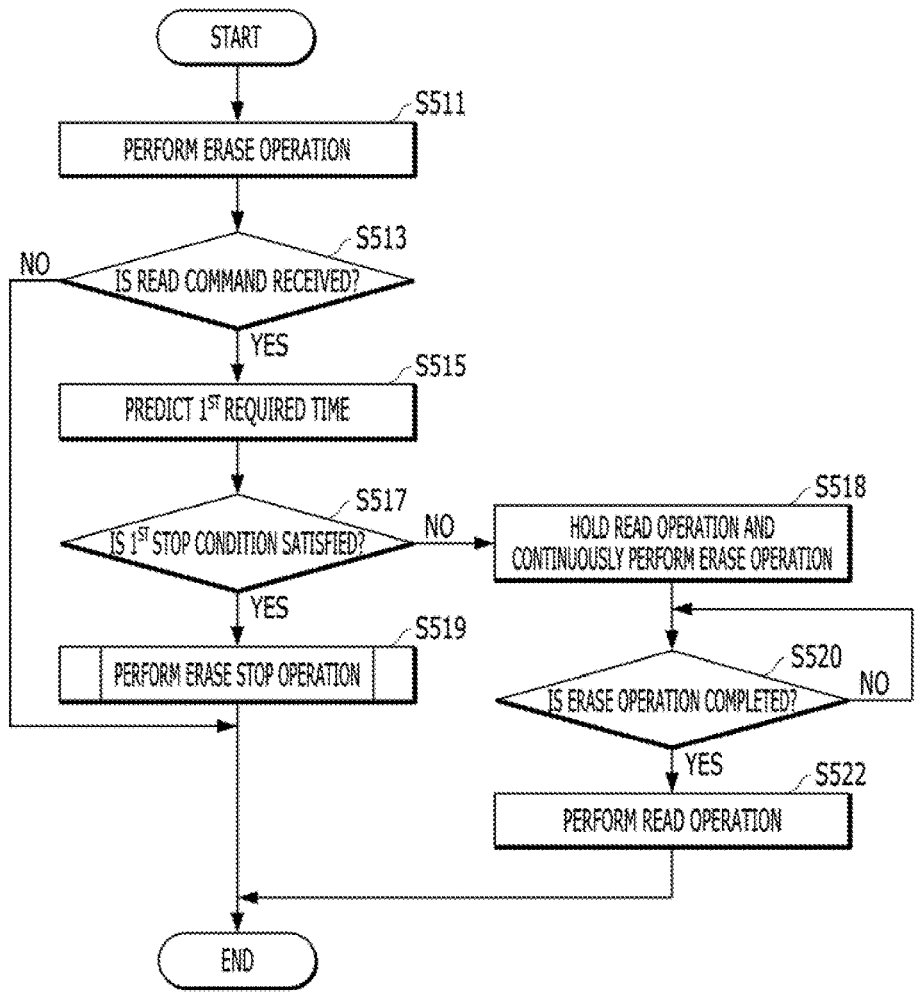
FIG. 5 is a flowchart illustrating an operating method of a memory system in accordance with an embodiment of the present invention.
FIGS. 6 and 7 are diagrams illustrating the operating method of FIG. 5.
Figure 7:
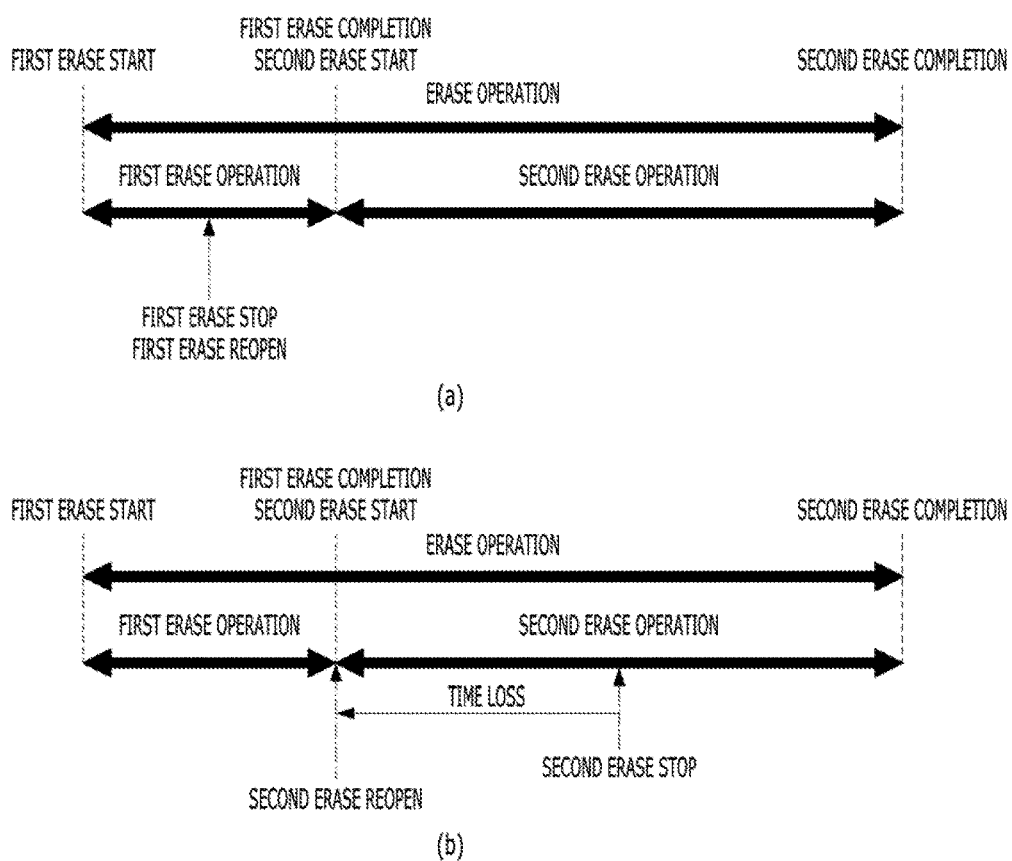

FIG. 5 is a flowchart illustrating an operating method of the memory system 110. FIGS. 6 and 7 are diagrams illustrating the operating method of FIG. 5.

Referring to FIG. 5, an operating method of the memory system 110 in accordance with an embodiment may start with step S511 in which the controller 130 performs an erase operation to the memory device 150. The processor 134 may access the memory device 150 through the memory controller 142, e.g., a NAND flash controller when the memory device is a NAND flash memory. The processor 134 may perform the erase operation to at least one of memory block 152 to 156 in the memory device 150.

For example, in an embodiment, when performing an erase operation to all of the plurality of memory blocks 152 to 156, the controller 130 may sequentially perform the erase operation starting with a first memory block among the plurality of the memory blocks 152 to 156, may then performing the erase operation to a second, third and so forth of the memory blocks 152 to 156. In another embodiment, when performing the erase operation to the plurality of memory blocks 152 to 156, the controller 130 may perform the erase operation sequentially but to at least a pair of memory blocks each time. Hence, for example, the controller 130 may simultaneously perform the erase operation to at least two of the memory blocks 152 to 156 at a first time. Then, the controller 130 may perform the erase operation to the next group of at least two of the memory blocks 152 to 156 of memory device 150 and repeat this process until all memory blocks that are to be erased have been erased. The controller 130 may perform the erase operation in correspondence with an erase command of the host 102. Alternatively, the controller 130 may perform the erase operation to the memory device 150 in a standby state of the memory system 110.

In accordance with an embodiment, the erase operation may include a first erase operation and a second erase operation. The first erase operation may represent an operation of selecting an erase target memory block from a plurality of memory blocks included in the memory device 150. The controller 130 may select at least one of the memory blocks 152 to 156 as an erase target memory block through the first erase operation. The second erase operation may represent an operation of erasing data from the erase target memory block. The controller 130 may perform the first erase operation and then perform the second erase operation subsequently to the first erase operation. Accordingly, an erase time required for the erase operation may be a sum of a first erase time for the first erase operation and a second erase time for the second erase operation. For example, the first erase time may be smaller than the second erase time.

While performing the erase operation to the memory device 150 in step S511, the controller 130 may receive a read command in step S513. That is, when the read command is received from the host 102 through the host interface unit 132, the processor 134 may detect the read command. The read command may include a logical address of data for performing a read operation.

In step S515, the controller 130 may then predict a first required time for completing the erase operation as a sum of a delay time for the read operation based on the read command and the erase time for the erase operation. For example, the delay time may be a sum of a time required for halting the erase operation and a time required for reopening the erase operation as well as a time required for the read operation. The delay time may be predetermined. For example, the delay time may include a maximum delay time (a maximum read latency) and a minimum delay time (a minimum read latency). Accordingly, the first required time may be a range of time including a first maximum required time as the sum of the erase time and the maximum delay time and a first minimum required time as the sum of the erase time and the minimum delay time.

In step S517, the controller 130 may compare the first required time with a predetermined first stop condition. The controller 130 may determine whether the first required time satisfies the first stop condition. The first stop condition may be a reference time for determining whether to halt the erase operation and perform the read operation.

In accordance with an embodiment, the first stop condition may be decided on the basis of the threshold time for ensuring intended target performance of the memory system 110. For example, the threshold time may be decided according to manufacturing companies of the memory system 110 as illustrated in FIG. 6. The first stop condition may require that the first required time is smaller than the threshold time. For example, the first stop condition may be decided such that the first minimum required time is smaller than the threshold time and the first maximum required time is smaller than the threshold time as expressed by Equation 1 below.

first minimum required time(erase time+minimum read latency)<threshold time, and first maximum required time(erase time+maximum read latency)<threshold time    Equation 1

For example, when the memory system 110 has been manufactured by a first manufacturing company, the first stop condition may be decided such that the erase operation should be completed in 6 ms in order to ensure target performance of 99.999%. When the memory system 110 has been manufactured by a second manufacturing company, the first stop condition may be decided such that the erase operation should be completed in 7 ms in order to ensure target performance of 99.99%. When the memory system 110 has been manufactured by a third manufacturing company, the first stop condition may be decided such that the erase operation should be completed in 8 ms in order to ensure target performance of 99.9999%.

When it is determined that the first required time does not satisfy the first stop condition (i.e., when the first minimum required time is equal to or greater than the threshold time) in step S517, the controller 130 may continuously perform and complete the on-going erase operation without performing the read operation in step S518. After the erase operation is completed in step S520, the controller 130 performs the held read operation in step S522. That is, when the first required time does not satisfy the first stop condition, the processor 134 may determine that the read operation is not performed during the erase operation and the read operation should be performed after the erase operation is completed. The first required time may be equal to or more than the threshold time. In other words, a fail to satisfy the first stop condition may represent that halting and reopening of the on-going erase operation due to the interrupting read operation may cause the erase operation not to be completed within the manufacturer's preset threshold time. Accordingly, when the first required time does not satisfy the first stop condition, the controller 130 may keep performing the on-going erase operation and then perform the read operation after completion of the erase operation.

When it is determined that the first required time satisfies the first stop condition (i.e., when the first maximum required time is smaller than the threshold time) in step S517, the controller 130 may halt the on-going erase operation, perform the read operation and reopen the halted erase operation after completion of the read operation in step S519. That is, when the first required time satisfies the first stop condition, the processor 134 may determine that the on-going erase operation may be completed within the threshold time even when a read operation interrupts the on-going erase operation. In other words, success to satisfy the first stop condition may represent that the on-going erase operation may be completed within the threshold time, even when a read operation interrupts the on-going erase operation. Accordingly, when the first required time satisfies the first stop condition, the controller 130 may halt the on-going erase operation, perform the read operation and reopen the halted erase operation after completion of the read operation. In this case, the erase stop operation may represent a series of procedures of halting the erase operation, performing the read operation, and reopening the halted erase operation. The processor 134 may detect a physical address of data corresponding to the read command. Then, processor 134 may perform a read operation for data on the basis of the physical address.

In accordance with an embodiment, when the first required time satisfies the first stop condition, the processor 134 may perform the read operation during the first erase operation as illustrated in (a) of FIG. 7. In this case, the processor 134 may halt the first erase operation and then perform the read operation. When the read operation is completed, the processor 134 may reopen the halted first erase operation and perform the remaining process of the first erase operation. When the first erase operation is completed, the processor 134 may perform the second erase operation.

In accordance with another embodiment, when a second required time satisfies the second stop condition (the second required time and the second stop condition will be described later with reference to FIG. 8), the processor 134 may perform the read operation during the second erase operation as illustrated in (b) of FIG. 7. In this case, the processor 134 may stop the second erase operation and then perform the read operation. When the read operation is completed, the processor 134 may start again the second erase operation from the beginning of the second erase operation. Therefore, a time loss may occur when the second erase operation stops and starts again from the beginning, as shown in (b) of FIG. 7.

Figure 8:
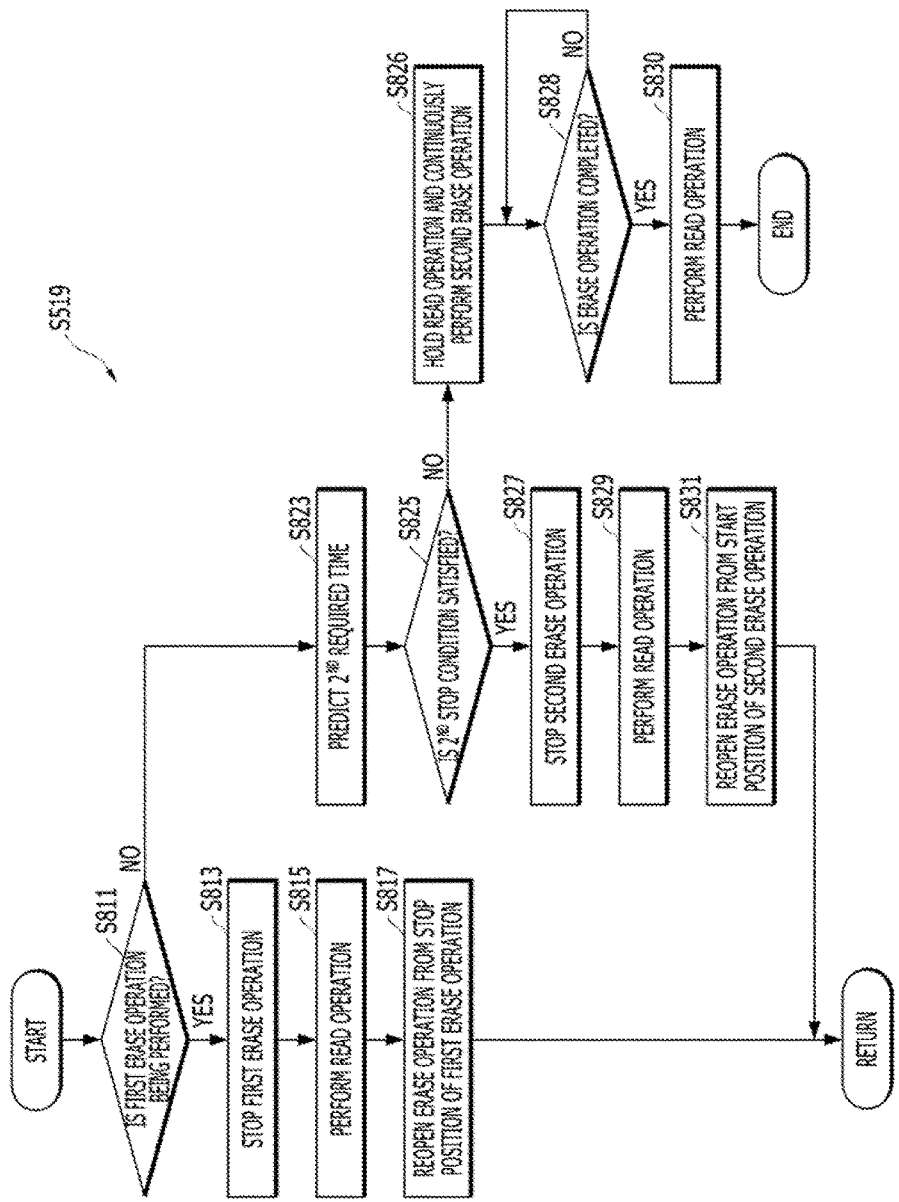
FIG. 8 is a flowchart illustrating an exemplary erase stop operation of the operation of FIG. 5.

FIG. 8 is a flowchart illustrating an erase stop operation in step S519 of FIG. 5.

Referring to FIG. 8, in step S811, the controller 130 may determine whether the first erase operation is being performed based on a time interval between a starting time point of the first erase operation and a starting time point of the read operation to be performed. For example, the starting time point of the read operation to be performed may be a current time point. When the time interval between the starting time point of the first erase operation and the starting time point of the read operation to be performed is smaller than the first erase time of the first erase operation, the processor 134 may determine that the first erase operation is being performed at the starting time point of the read operation to be performed.

In step S811, when it is determined that the first erase operation is being performed at the starting time point of the read operation to be performed, the controller 130 may halt the first erase operation in step S813. For example, the processor 134 may stop the first erase operation at the current time point. In this case, the processor 134 may decide the current time point as a halt time point of the first erase operation. In step 815, the controller 130 may perform the read operation in response to the read command. In step 817, the controller 130 may reopen the halted first erase operation and perform remaining process of the first erase operation. That is, the controller 130 may perform process after the halt time point of the first erase operation, and then perform the second erase operation to complete the erase operation. Then, the controller 130 may end the operation.

In step 811, when it is determined that the first erase operation is not being performed, the controller 130 may determine whether the second erase operation is being performed in step 821. In this case, the processor 134 may compare the read operation start time point and the erase operation start time point. For example, the processor 134 may compare a current time point with the start time point of the first erase operation. Then, the processor 134 may determine whether a time interval between the read operation start time point and the erase operation start time point exceeds the first erase time of the first erase operation. When the time interval between the read operation start time point and the erase operation start time point exceeds the first erase time of the first erase operation, the processor 134 may determine that the second erase operation is being performed.

In step S823, the controller 130 predicts a second required time. In step S823, the second required time is predicted by further adding into the first required time the time loss occurring when the second erase operation stops and starts again from the beginning as described with reference to (b) of FIG. 7. That is, the second required time is predicted by adding into the first required time the time loss or the time difference between the starting time point of the second erase operation and the starting time point of the read operation to be performed.

In step 825, the controller 130 may compare the second required time with a predetermined second stop condition. The controller 130 may determine whether the second required time satisfies the second stop condition. Like the first stop condition of step S515, the second stop condition may be a reference time for determining whether to halt the erase operation and perform the read operation.

In accordance with an embodiment, the second stop condition may be decided on the basis of a threshold time for ensuring an intended target performance of the memory system 110. For example, the second stop condition may be decided according to manufacturing companies of the memory system 110 as described with reference to FIG. 6. The second stop condition may require that the second required time is smaller than the threshold time. For example, the second stop condition may be decided such that the second minimum required time is smaller than the threshold time and the second maximum required time is smaller than the threshold time as expressed by Equation 2 below.

$$\text{second minimum required time(erase time+minimum read latency+time loss)} < \text{threshold time, and}$$

$$\text{second maximum required time(erase time+maximum read latency+time loss)} < \text{threshold time} \quad \text{Equation 2}$$

When it is determined that the second required time does not satisfy the second stop condition (i.e., when the second minimum required time is equal to or greater than the threshold time) in step S825, the controller 130 continuously performs and completes the on-going second erase operation without performing the read operation in step S826. After the second erase operation is completed in step S828, the controller 130 performs the held read operation in step S830. That is, when the second required time does not satisfy the second stop condition, the processor 134 may determine that the read operation is not performed during the second erase operation and the read operation should be performed after the second erase operation is completed. The second required time may be equal to or more than the threshold time. In other words, fail to satisfy the second stop condition may represent that halt and restart of the on-going erase operation due to the interrupting read operation may cause the erase operation not to be completed within the threshold time. Accordingly, when the second required time does not satisfy the second stop condition, the controller 130 may keep performing the on-going second erase operation and then perform the read operation after completion of the second erase operation.

When it is determined that the second required time satisfies the second stop condition (i.e., when the second maximum required time is smaller than the threshold time) in step S825, the controller 130 may halt the on-going second erase operation in step S827, perform the read operation in step S829 and start from the beginning the halted erase operation after completion of the read operation in step S831. That is, when the second required time satisfies the second stop condition, the processor 134 may determine that the on-going second erase operation may be completed within the threshold time even when a read operation interrupts the on-going second erase operation. In other words, success to satisfy the second stop condition may represent that the on-going second erase operation may be completed within the threshold time, even when a read operation interrupts the on-going second erase operation. Accordingly, when the second required time satisfies the second stop condition, the controller 130 may halt the on-going second erase operation, perform the read operation and start the second erase operation from the beginning after completion of the read operation. For example, the processor 134 may stop the second erase operation at the current time point in step S827. In this case, the processor 134 may decide a current time point as a halt time point of the second erase operation. In step S829, the controller 130 may perform the read operation in response to the read command. In step 831, the controller 130 may start the second erase operation from the beginning.

After the erase stop operation in step S519 is performed, the process may end.

Hereinbelow, detailed descriptions will be made with reference to FIGS. 9 to 14, for a data processing system and electronic appliances to which the memory system 110 including the memory device 150 and the controller 130 described above with reference to FIGS. 1 to 8, according to the embodiment, is applied.

Figure 9:
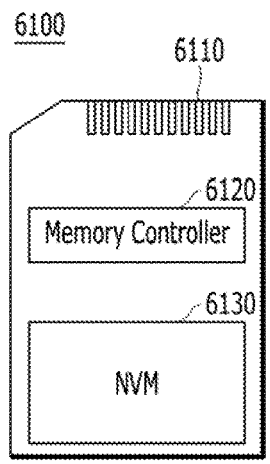
FIGS. 9 to 14 are diagrams illustrating examples of memory systems according to embodiments of the present invention.

FIG. 9 is a diagram illustrating a data processing system including a memory system according to an embodiment of the present invention. FIG. 9 specifically illustrates a memory card system to which the memory system according to an embodiment is applied.

Referring to FIG. 9, a memory card system 6100 includes a memory controller 6120, a memory device 6130, and a connector 6110.

In detail, the memory controller 6120 may be connected with the memory device 6130 and may access the memory device 6130. In some embodiments, the memory device 6130 may be implemented with a nonvolatile memory (NVM). For example, the memory controller 6120 may control read, write, erase and background operations for the memory device 6130. The memory controller 6120 may provide an interface between the memory device 6130 and a host (not shown), and may drive a firmware for controlling the memory device 6130. For example, the memory controller 6120 may correspond to the controller 130 in the memory system 110 described above with reference to FIG. 1, and the memory device 6130 may correspond to the memory device 150 in the memory system 110 described above with reference to FIG. 1.

Therefore, the memory controller 6120 may include components such as a random access memory (RAM), a processing unit, a host interface, a memory interface and an error correction unit as shown in FIG. 1.

The memory controller 6120 may communicate with an external device (for example, the host 102 described above with reference to FIG. 1), through the connector 6110. For example, as described above with reference to FIG. 1, the memory controller 6120 may be configured to communicate with the external device through at least one of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (ESDI), Integrated Drive Electronics (IDE), Firewire, universal flash storage (UFS), wireless-fidelity (WI-FI) and Bluetooth. Accordingly, the memory system and the data processing system according to the embodiment may be applied to wired/wireless electronic appliances, For example, a mobile electronic appliance.

The memory device 6130 may be implemented with a nonvolatile memory. For example, the memory device 6130 may be implemented with various nonvolatile memory devices such as an electrically erasable and programmable ROM (EPROM), a NAND flash memory, a NOR flash memory, a phase-change RAM (PRAM), a resistive RAM (ReRAM), a ferroelectric RAM (FRAM) and a spin torque transfer magnetic RAM (STT-MRAM).

The memory controller 6120 and the memory device 6130 may be integrated into a single semiconductor device. For example, the memory controller 6120 and the memory device 6130 may construct a solid state driver (SSD) by being integrated into a single semiconductor device. The memory controller 6120 and the memory device 6130 may construct a memory card such as a PC card (PCMCIA: Personal Computer Memory Card International Association), a compact flash card (CF), a smart media card (SM and SMC), a memory stick, a multimedia card (MMC, RS-MMC, MMCmicro and eMMC), an SD card (e.g., SD, miniSD, microSD and SDHC) and a universal flash storage (UFS).

Figure 10:
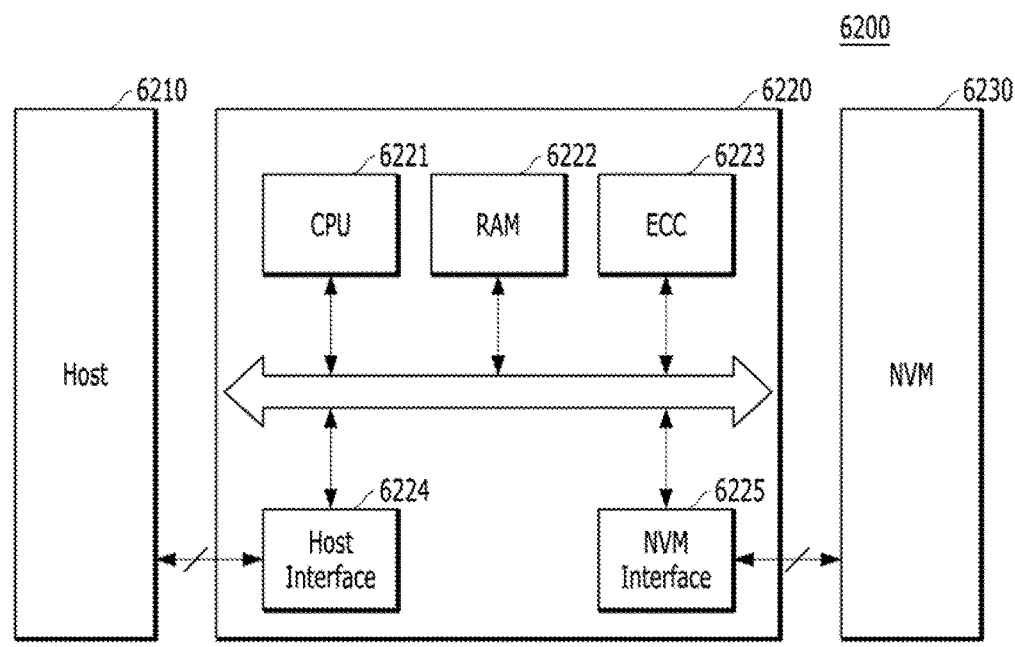

FIG. 10 is a diagram schematically illustrating an example of a data processing system including a memory system according to an embodiment of the present invention.

Referring to FIG. 10, a data processing system 6200 includes a memory device 6230 which may be implemented with at least one nonvolatile memory (NVM) and a memory controller 6220 for controlling the memory device 6230. The data processing system 6200 may be a storage medium such as a memory card (e.g., CF, SD and microSD), as described above with reference to FIG. 1. The memory device 6230 may correspond to the memory device 150 in the memory system 110 described above with reference to FIG. 1, and the memory controller 6220 may correspond to the controller 130 in the memory system 110 described above with reference to FIG. 1.

The memory controller 6220 may control the operations, including the read, write and erase operations for the memory device 6230 in response to requests received from a host 6210. The memory controller 6220 may include a central processing unit (CPU) 6221, a random access memory (RAM) as a buffer memory 6222, an error correction code (ECC) circuit 6223, a host interface 6224, and an NVM interface as a memory interface 6225, all coupled via an internal bus.

The CPU 6221 may control the operations for the memory device 6230 such as read, write, file system management, bad page management, and so forth. The RAM 6222 may operate according to control of the CPU 6221, and may be used as a work memory, a buffer memory, a cache memory, or the like. In the case where the RAM 6222 is used as a work memory, data processed by the CPU 6221 is temporarily stored in the RAM 6222. In the case where the RAM 6222 is used as a buffer memory, the RAM 6222 is used to buffer data to be transmitted from the host 6210 to the memory device 6230 or from the memory device 6230 to the host 6210. In the case where the RAM 6222 is used as a cache memory, the RAM 6222 may be used to enable the memory device 6230 with a low speed to operate at a high speed.

The ECC circuit 6223 corresponds to the ECC unit 138 of the controller 130 described above with reference to FIG. 1. As described above with reference to FIG. 1, the ECC circuit 6223 may generate an error correction code (ECC) for correcting a fail bit or an error bit in the data received from the memory device 6230. The ECC circuit 6223 may perform error correction encoding for data to be provided to the memory device 6230, and may generate data added with parity bits. The parity bits may be stored in the memory device 6230. The ECC circuit 6223 may perform error correction decoding for data outputted from the memory device 6230. At this time, the ECC circuit 6223 may correct errors by using the parity bits. For example, as described above with reference to FIG. 1, the ECC circuit 6223 may correct errors by using various coded modulations such as of a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM) and a Block coded modulation (BCM).

The memory controller 6220 transmits and receives data to and from the host 6210 through the host interface 6224, and transmits and receives data to and from the memory device 6230 through the NVM interface 6225. The host interface 6224 may be connected with the host 6210 through at least one of various interface protocols such as a parallel advanced technology attachment (PATA) bus, a serial advanced technology attachment (SATA) bus, a small computer system interface (SCSI), a universal serial bus (USB), a peripheral component interconnection express (PCIe) or a NAND interface. Further, as a wireless communication function or a mobile communication protocol such as wireless fidelity (WI-FI) or long term evolution (LTE) is realized, the memory controller 6220 may transmit and receive data by being connected with an external device such as the host 6210 or another external device other than the host 6210. Specifically, as the memory controller 6220 is configured to communicate with an external device through at least one among various communication protocols, the memory system and the data processing system according to the embodiment may be applied to wired/wireless electronic appliances, For example, a mobile electronic appliance.

Figure 11:
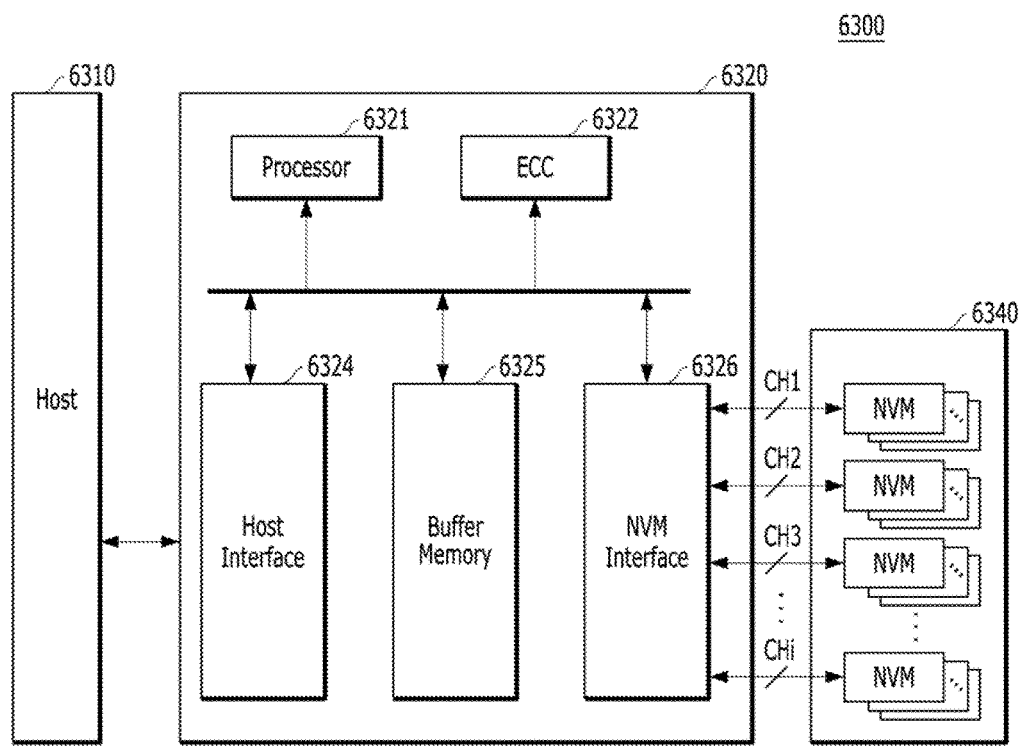

FIG. 11 is a diagram illustrating a data processing system including a memory system according to an embodiment of the invention. FIG. 11 may be a solid state drive (SSD).

Referring to FIG. 11, an SSD 6300 may include a memory device 6340 which may include a plurality of nonvolatile memories NVM, and a controller 6320. The controller 6320 may correspond to the controller 130 in the memory system 110 described above with reference to FIG. 1, and the memory device 6340 may correspond to the memory device 150 in the memory system 110 described above with reference to FIG. 1.

In detail, the controller 6320 may be connected with the memory device 6340 through a plurality of channels CH1, CH2, CH3, . . . and CHi. The controller 6320 may include a processor 6321, a buffer memory 6325, an error correction code (ECC) circuit 6322, a host interface 6324, and a nonvolatile memory (NVM) interface as a memory interface 6326 coupled via an internal bus.

The buffer memory 6325 temporarily stores data received from a host 6310 or data received from a plurality of nonvolatile memories NVMs included in the memory device 6340, or temporarily stores metadata of the plurality of nonvolatile memories NVMs. For example, the metadata may include map data including mapping tables. The buffer memory 6325 may be implemented with a volatile memory such as, but not limited to, a dynamic random access memory (DRAM), a synchronous dynamic random access memory (SDRAM), a double data rate (DDR) SDRAM, a low power double data rate (LPDDR) SDRAM and a graphic random access memory (GRAM) or a nonvolatile memory such as, but not limited to, a ferroelectric random access memory (FRAM), a resistive random access memory (ReRAM), a spin-transfer torque magnetic random access memory (STT-MRAM) and a phase change random access memory (PRAM). While it is illustrated in FIG. 11, for the sake of convenience in explanation, that the buffer memory 6325 is disposed inside the controller 6320, it is to be noted that the buffer memory 6325 may be disposed outside the controller 6320.

The ECC circuit 6322 calculates error correction code values of data to be programmed in the memory device 6340 in a program operation, performs an error correction operation for data read from the memory device 6340, based on the error correction code values, in a read operation, and performs an error correction operation for data recovered from the memory device 6340 in a recovery operation for failed data.

The host interface 6324 provides an interface function with respect to an external device such as the host 6310. The nonvolatile memory interface 6326 provides an interface function with respect to the memory device 6340 which is connected through the plurality of channels CH1, CH2, CH3, . . . and CHi.

As a plurality of SSDs 6300 to each of which the memory system 110 described above with reference to FIG. 1 is applied are used, a data processing system such as a redundant array of independent disks (RAID) system may be implemented. In the RAID system, the plurality of SSDs 6300 and an RAID controller for controlling the plurality of SSDs 6300 may be included. In the case of performing a program operation by receiving a write command from the host 6310, the RAID controller may select at least one memory system (For example, at least one SSD 6300) in response to the RAID level information of the write command received from the host 6310, among a plurality of RAID levels (for example, the plurality of SSDs 6300) and may output data corresponding to the write command, to the selected SSD 6300. In the case of performing a read operation by receiving a read command from the host 6310, the RAID controller may select at least one memory system (For example, at least one SSD 6300) in response to the RAID level information of the write command received from the host 6310, among the plurality of RAID levels (for example, the plurality of SSDs 6300), and may provide data outputted from the selected SSD 6300, to the host 6310.

Figure 12:
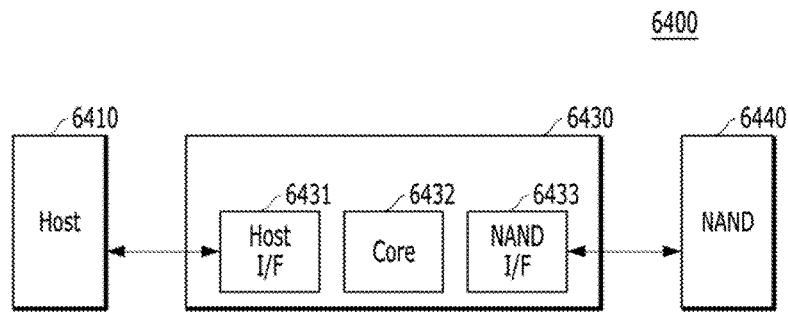

FIG. 12 is a diagram illustrating another example of a data processing system including a memory system according to an embodiment of the present invention. FIG. 12 is a drawing schematically illustrating an embedded multimedia card (eMMC) to which a memory system according to an embodiment is applied.

Referring to FIG. 12, an eMMC 6400 includes a memory device 6440 which is implemented with at least one NAND flash memory, and a controller 6430. The controller 6430 may correspond to the controller 130 in the memory system 110 described above with reference to FIG. 1, and the memory device 6440 may correspond to the memory device 150 in the memory system 110 described above with reference to FIG. 1.

In detail, the controller 6430 may be connected with the memory device 6440 through a plurality of channels. The controller 6430 may include a core 6432, a host interface 6431, and a memory interface such as a NAND interface 6433.

The core 6432 may control the operations of the eMMC 6400. The host interface 6431 may provide an interface function between the controller 6430 and a host 6410. The NAND interface 6433 may provide an interface function between the memory device 6440 and the controller 6430. For example, the host interface 6431 may be a parallel interface such as an MMC interface, as described above with reference to FIG. 1, or a serial interface such as an ultra-high speed class 1 (UHS-I)/UHS class 2 (UHS-II) and a universal flash storage (UFS) interface.

Figure 13:
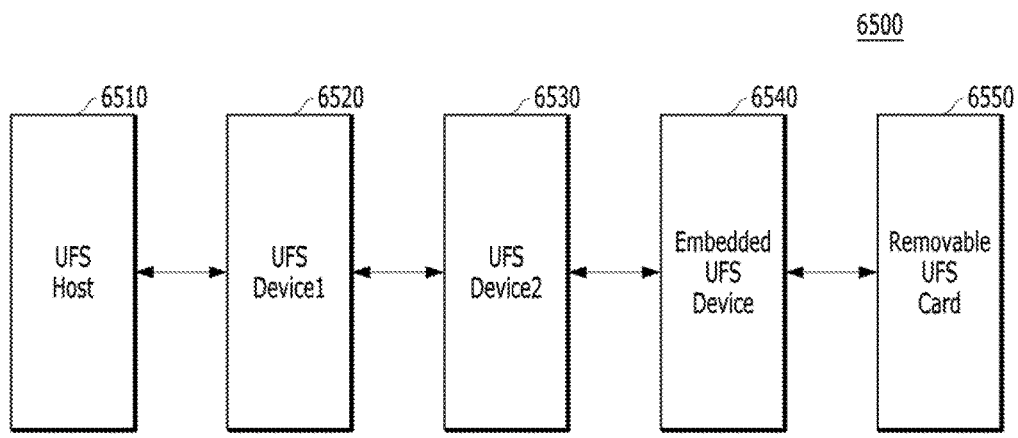

FIG. 13 is a diagram illustrating another example of a data processing system including a memory system according to an embodiment of the present invention. FIG. 12 illustrates a universal flash storage (UFS) to which the memory system according to an embodiment is applied.

Referring to FIG. 13, a UFS system 6500 may include a UFS host 6510, a plurality of UFS devices 6520 and 6530, an embedded UFS device 6540, and a removable UFS card 6550. The UFS host 6510 may be an application processor of wired/wireless electronic appliances, for example, a mobile electronic appliance.

The UFS host 6510, the UFS devices 6520 and 6530, the embedded UFS device 6540 and the removable UFS card 6550 may respectively communicate with external devices such as wired/wireless electronic appliances (for example, a mobile electronic appliance), through a UFS protocol. The UFS devices 6520 and 6530, the embedded UFS device 6540 and the removable UFS card 6550 may be implemented with the memory system 110 described above with reference to FIG. 1, for example, as the memory card system 6100 described above with reference to FIG. 9. The embedded UFS device 6540 and the removable UFS card 6550 may communicate through another protocol other than the UFS protocol. For example, the embedded UFS device 6540 and the removable UFS card 6550 may communicate through various card protocols such as, but not limited to, USB flash drives (UFDs), multimedia card (MMC), secure digital (SD), mini SD and Micro SD.

Figure 14:
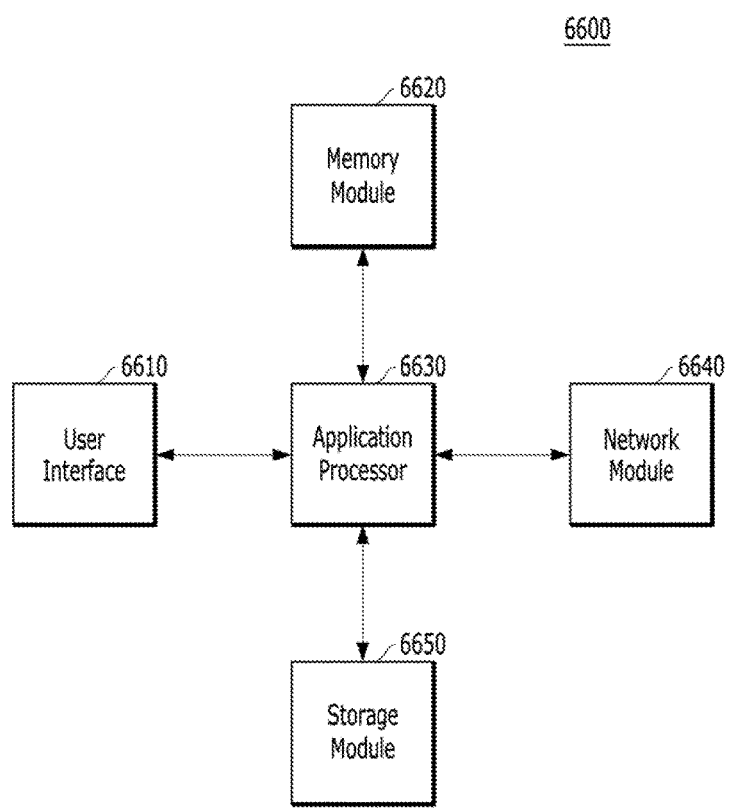

FIG. 14 is a diagram illustrating an example of a data processing system including the memory system according to an embodiment of the present invention. FIG. 14 is a drawing schematically illustrating a user system to which the memory system according to the embodiment is applied.

Referring to FIG. 14, a user system 6600 may include an application processor 6630, a memory module 6620, a network module 6640, a storage module 6650, and a user interface 6610.

The application processor 6630 may drive components included in the user system 6600 and an operating system (OS). For example, the application processor 6630 may include controllers for controlling the components included in the user system 6600, interfaces, graphics engines, and so on. The application processor 6630 may be provided by a system-on-chip (SoC).

The memory module 6620 may operate as a main memory, a working memory, a buffer memory or a cache memory of the user system 6600. The memory module 6620 may include a volatile random access memory such as a dynamic random access memory (DRAM), a synchronous dynamic random access memory (SDRAM), a double data rate (DDR) SDRAM, a DDR2 SDRAM, a DDR3 SDRAM, a low power double data rate (LPDDR) SDRAM, an LPDDR2 SDRAM and an LPDDR3 SDRAM or a nonvolatile random access memory such as a phase change random access memory (PRAM), a resistive random access memory (ReRAM), a magnetic random access memory (MRAM) and a ferroelectric random access memory (FRAM). For example, the application processor 6630 and the memory module 6620 may be mounted by being packaged on the basis of a package-on-package (POP).

The network module 6640 may communicate with external devices. For example, the network module 6640 may support not only wired communications but also various wireless communications such as code division multiple access (CDMA), global system for mobile communication (GSM), wideband CDMA (WCDMA), CDMA-2000, time division multiple access (TDMA), long term evolution (LTE), worldwide interoperability for microwave access (WiMAX), wireless local area network (WLAN), ultra-wideband (UWB), Bluetooth, wireless display (WI-DI), and so on, and may thereby communicate with wired/wireless electronic appliances, For example, a mobile electronic appliance. According to this fact, the memory system and the data processing system according to the embodiment may be applied to wired/wireless electronic appliances. The network module 6640 may be included in the application processor 6630.

The storage module 6650 may store data such as data received from the application processor 6530, and transmit data stored therein, to the application processor 6530. The storage module 6650 may be realized by a nonvolatile semiconductor memory device such as a phase-change RAM (PRAM), a magnetic RAM (MRAM), a resistive RAM (ReRAM), a NAND flash memory, a NOR flash memory and a 3-dimensional NAND flash memory. The storage module 6650 may be provided as a removable storage medium such as a memory card of the user system 6600 and an external drive. For example, the storage module 6650 may correspond to the memory system 110 described above with reference to FIG. 1, and may be implemented with the SSD, eMMC and UFS described above with reference to FIGS. 11 to 13.

The user interface 6610 may include interfaces for inputting data or commands to the application processor 6630 or for outputting data to an external device. For example, the user interface 6610 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, a light emitting diode (LED), a speaker and a motor.

In the case where the memory system 110 described above with reference to FIG. 1 is applied to the mobile electronic appliance of the user system 6600 according to an embodiment, the application processor 6630 may control the operations of the mobile electronic appliance, and the network module 6640 as a communication module may control wired/wireless communication with an external device, as described above. The user interface 6610 as the display/touch module of the mobile electronic appliance displays data processed by the application processor 6630 or supports input of data from a touch panel.

In accordance with various embodiments, the memory system 110 may predict a required time for an erase operation on the basis of a delay time due to a read operation, and may hold a read command detected while performing an erase operation for optimizing the operation of the memory system. For example, when a read command is detected during the erase operation, the memory system 110 may hold the read command and allow the read operation to be performed after the erase operation for maintaining the erase operation time within an optimal range. Accordingly, the memory system 110 may continuously perform the erase operation regardless of the read command if continuous operation is needed for maintaining the required time for the erase operation within an optimal range. Thus, the memory system 110 may optimize the erase operation and the overall operational efficiency.

Although various embodiments have been described for illustrative purposes, it will be apparent to those skilled in the art that various other embodiments, changes and modifications thereof may be made without departing from the spirit and scope of the invention as defined in the following claims.

What is claimed is:

1. A memory system comprising:
a memory device; and
a controller configured to:
perform a read operation and an erase operation to the memory device;
predict a first required time when a read command is received during the performing of the erase operation, the first required time being based on a sum including a first time required for the read operation in response to the read command and a second time required for the on-going erase operation; and
determine whether to halt or continue the erase operation according to the first required time.

2. The memory system of claim 1, wherein the first required time further includes a time required to halt the on-going erase operation and reopen the halted erase operation.

3. The memory system of claim 1,
wherein the erase operation includes a first erase operation of selecting a target memory block from memory blocks, and a second erase operation of erasing data stored in the selected target memory block, and
wherein, when the first required time is smaller than a threshold time and the read command is provided during the first erase operation, the controller halts the on-going erase operation, performs the read operation, and reopens the halted erase operation after the read operation is completed.

4. The memory system of claim 3, wherein, when the first required time is equal to or greater than the threshold time, the controller performs the read operation after completion the on-going erase operation.

5. The memory system of claim 1,
wherein the erase operation includes a first erase operation of selecting a target memory block from memory blocks, and a second erase operation of erasing data stored in the selected target memory block, and
wherein, when the first required time is smaller than a threshold time and the read command is provided during the second erase operation, the controller further predicts a second required time, which is a sum of a first time required for the read operation in response to the read command, a second time required for the on-going erase operation and a time loss to occur when the second erase operation stops and starts from a beginning, and sequentially performs one and the other between the read operation and the second erase operation according to the second required time.

6. The memory system of claim 5, wherein the first time includes a time required to halt the on-going second erase operation and start the halted second erase operation.

7. The memory system of claim 5, wherein, when the second required time is smaller than a threshold time, the controller halts the on-going second erase operation, performs the read operation, and starts the second erase operation from the beginning after the read operation is completed.

8. The memory system of claim 5, wherein, when the second required time is equal to or greater than the threshold time, the controller performs the read operation after completion the on-going second erase operation.

9. An operating method of a memory system including a memory device, the operating method comprising:
performing an erase operation to the memory device;
predicting a first required time, which is a sum of a first time required for a read operation in response to a read command and a second time required for the on-going erase operation when the read command is provided during the erase operation; and
sequentially performing one and the other one between the read operation and the on-going erase operation according to the first required time.

10. The operating method of claim 9, wherein the first time includes a time required to halt the on-going erase operation and reopen the halted erase operation.

11. The operating method of claim 9,
wherein the erase operation includes a first erase operation of selecting a target memory block from memory blocks, and a second erase operation of erasing data stored in the selected target memory block, and
wherein, when the first required time is smaller than a threshold time and the read command is provided during the first erase operation, the sequentially performing includes:
halting the on-going erase operation;
performing the read operation; and
reopening the halted erase operation after the read operation is completed.

12. The operating method of claim 11, wherein, when the first required time is equal to or greater than the threshold time, the sequentially performing includes performing the read operation after completion the on-going erase operation.

13. The operating method of claim 9,
wherein the erase operation includes a first erase operation of selecting a target memory block from memory blocks, and a second erase operation of erasing data stored in the selected target memory block, and
wherein, when the first required time is smaller than a threshold time and the read command is provided during the second erase operation, the sequentially performing includes:
predicting a second required time, which is a sum of a first time required for the read operation in response to the read command, a second time required for the on-going erase operation and a time loss to occur when the second erase operation stops and starts from a beginning; and
sequentially performing one and the other between the read operation and the second erase operation according to the second required time.

14. The operating method of claim 13, wherein the first time includes a time required to halt the on-going second erase operation and start the halted second erase operation.

15. The operating method of claim 14, wherein, when the second required time is smaller than a threshold time, the sequentially performing includes:
halting the on-going second erase operation;
performing the read operation; and
starting the second erase operation from the beginning after the read operation is completed.

16. The operating method of claim 13, wherein, when the second required time is equal to or greater than the threshold time, the sequentially performing includes performing the read operation after completion the on-going second erase operation.

* * * * *